(12) United States Patent
Kim

(10) Patent No.: US 8,273,652 B2
(45) Date of Patent: Sep. 25, 2012

(54) SEMICONDUCTOR MEMORY DEVICE AND METHOD OF MANUFACTURING THE SAME

(75) Inventor: Sang Min Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/246,726

(22) Filed: Sep. 27, 2011

(65) Prior Publication Data

US 2012/0021595 A1    Jan. 26, 2012

Related U.S. Application Data

(62) Division of application No. 12/417,341, filed on Apr. 2, 2009, now Pat. No. 8,026,547.

(30) Foreign Application Priority Data

Apr. 4, 2008 (KR) .................. 10-2008-0031619

(51) Int. Cl.
*H01L 21/4763* (2006.01)
(52) U.S. Cl. ........ 438/618; 438/142; 438/586; 438/622; 438/637; 438/672; 257/213; 257/295; 257/306; 257/310; 257/314; 257/E21.576
(58) Field of Classification Search .................. None
See application file for complete search history.

(56) References Cited

U.S. PATENT DOCUMENTS

| 5,907,788 A | 5/1999 | Kasai | |
| 6,255,151 B1 * | 7/2001 | Fukuda et al. | 438/197 |

FOREIGN PATENT DOCUMENTS

| KR | 1019990016230 A | 3/1999 |
| KR | 1020020056474 A | 7/2002 |
| KR | 100632656 B1 | 9/2006 |
| KR | 100751677 B1 | 8/2007 |

* cited by examiner

*Primary Examiner* — Kyoung Lee
(74) *Attorney, Agent, or Firm* — Kilpatrick Townsend & Stockton LLP

(57) ABSTRACT

A method of manufacturing a semiconductor device includes providing a substrate having junction regions and contact plugs formed thereon. A second insulating layer is formed over a first insulating layer and includes first and second pad holes extending in different directions and exposing the contact plugs. First and second conductive pads are formed in the first and second pad holes, respectively. A third insulating layer is formed and includes dual damascene patterns and pad contact holes. The dual damascene pattern exposes the first conductive pad, and each pad contact hole exposes a second conductive pad. First pad contact plugs and a first bit line are formed in the dual damascene pattern and a second pad contact plug is formed in each pad contact hole. A fourth insulating layer including trenches is formed. Each trench exposes a second pad contact plug. A second bit line is formed in each trench.

12 Claims, 15 Drawing Sheets

SEMICONDUCTOR MEMORY DEVICE AND METHOD OF MANUFACTURING THE SAME

CROSS-REFERENCE TO RELATED APPLICATIONS

This application is a divisional of U.S. patent application Ser. No. 12/417,341, filed on Apr. 2, 2009, which claims priority from Korean Patent Application No. 10-2008-0031619, filed on Apr. 4, 2008, the contents of which are incorporated herein by reference in their entirety.

BACKGROUND OF THE INVENTION

The present invention relates to a semiconductor memory device and a method of manufacturing the same, and more particularly to a semiconductor memory device in which side surfaces of neighboring bit lines do not face each other to reduce a capacitance of a parasitic capacitor formed between the neighboring bit lines for enabling an operation speed of semiconductor memory device to be improved and to prevent a void from being generated in a contact plug.

In recent years, research on a semiconductor memory device with high integration and improved performance has been actively conducted. A problem caused by a high integration NAND flash memory device is described in detail below.

The NAND-type flash memory device consists of a plurality of cell strings. Each cell string comprises a source select transistor, a plurality memory cells and a drain select transistor which are connected to each other in series. A source of the source select transistor is connected to a common source line, and a drain of the drain select transistor is connected to a bit line. Gates of the source select transistors are connected to each other to form a source select line, gates of the drain select transistors are connected to each other to form a drain select line, and gates of the memory cells are connected to each other to form a word line.

The gate pattern including the word line, the source select line and the drain select line has a structure in which a tunnel insulating layer, a floating gate, a dielectric layer and a control gate are sequentially laminated. The dielectric layer comprises contact holes through which the floating gate of the source select line and the floating gate of the drain select line are exposed. The floating gate exposed through the contact holes is electrically connected to the control gate.

A lower structure of the flash memory device including the gate pattern is covered with an insulating layer to isolate the lower structure from an upper structure including the common source line and the bit line. The upper structure and the lower structure are electrically connected through a contact hole formed in the insulating layer and a contact plug formed in the contact hole.

As memory devices become highly integrated, a distance between the bit lines becomes smaller. An insulating layer is formed between the bit lines and side surfaces of the bit lines face each other. Thus, a capacitance of a parasitic capacitor formed between the bit lines is increased in inverse-proportion to the distance between the bit lines. An increase of the capacitance of the parasitic capacitor formed between the bit lines causes a resistive capacitive (RC) properties to decrease an operation speed of the semiconductor memory device.

Accordingly, a high integration semiconductor memory device having a reduced capacitance of a parasitic capacitor formed between the bit lines is required.

As semiconductor memory devices become more highly integrated, a plurality of patterns are formed with a stack structure in which an insulating layer is disposed between the patterns. Accordingly, an aspect ratio of the contact hole is increased. An increase of the aspect ratio of the contact hole causes generation of a void when a contact plug is formed, and the void results in a poor quality semiconductor memory device.

Accordingly, a semiconductor memory device is required which is suitable for high integration and is capable of preventing a void from being generated in a contact plug.

SUMMARY OF THE INVENTION

A semiconductor memory device has side surfaces of neighboring bit lines that do not face each other to reduce a capacitance of a parasitic capacitor formed between adjacent bit lines. This enables an operation speed of the semiconductor memory device to be improved and prevents a void from being generated in a contact plug.

A semiconductor memory device according to the present invention comprises contact plugs formed on a semiconductor substrate. Each contact plug is disposed between gate patterns. First and second conductive pads extend in different directions and are connected to the contact plugs. First and second pad contact plugs are formed on extended peripheries of the first and second conductive pads, respectively. Each of the first pad contact plugs has a height which differs from a height of each of the second pad contact plugs. First bit lines are connected to the first pad contact plugs, respectively; and second bit lines are connected to the second pad contact plugs, respectively.

A method of manufacturing a semiconductor memory device comprises providing a semiconductor substrate having junction regions and contact plugs formed thereon. Each junction region is formed between gate patterns, and each contact plug is connected to the corresponding junction region in a first insulation layer with which the gate patterns are covered. A second insulating layer is formed and includes first and second pad holes. The first and second pad holes extend in different directions. The first and second pad holes expose the contact plugs. First and second conductive pads are formed in the first and second pad holes, respectively. A third insulating layer is formed and includes dual damascene patterns and pad contact holes. The dual damascene pattern exposes an extended portion of each of the first conductive pads, and each pad contact hole exposes an extended portion of one of the second conductive pads. First pad contact plugs and a first bit line are formed in the dual damascene pattern and a second pad contact plug is formed in each pad contact hole. A fourth insulating layer including trenches is formed and each trench exposes one of the second pad contact plugs. A second bit line is then formed in each trench.

A method of manufacturing a semiconductor memory device comprises providing a semiconductor substrate having junction regions. Each junction region is formed between gate patterns. First and second insulating layers are formed on the semiconductor substrate. First damascene patterns are formed in the first and second insulating layers. Each first damascene pattern comprises first and second pad holes and contact holes in communication with the first and second pad holes. The first and second pad holes expose the first insulating layer and extend in different directions. The contact holes are formed in the first insulating layer to expose the junction regions. A contact plug is formed in each contact hole. A first conductive pad is formed in each first pad hole and a second conductive pad is formed in each second pad hole. A third insulating layer including a second dual damascene pattern is formed to expose an extended portion of each first conductive pad. The third insulating layer also includes pad contact holes that each expose an extended portion of one of the second conductive pads. First pad contact plugs and a first bit line are formed in the second dual damascene pattern and a second pad contact plug is formed in each pad contact hole. A fourth insulating layer including trenches is formed and each trench exposes one of the second pad contact plugs. A second bit line is then formed in each trench.

The gate pattern comprises a tunnel insulating layer, a floating gate, a dielectric layer and a control gate formed sequentially and laminately over the semiconductor substrate.

The first conductive pads and the second conductive pads are alternately disposed.

In the first and second conductive pads, a width of portions to be connected to the first and second pad contact plugs is larger than a width of portions through which the contact plugs are exposed.

Each of the second pad contact plugs have a height that is larger than each of the first pad contact plugs.

The first and second conductive pads extend such that the gate patterns intersect the first and second conductive pads.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in detail with reference to the accompanying drawings. However, it should be understood that embodiments of the present invention can be variously modified, a scope of the present invention is not limited to the embodiments described herein, and the embodiments are provided for explaining more completely the present invention to those skilled in the art.

A semiconductor memory device according to embodiments of the present invention comprises a number of cell arrays. Each of the cell arrays includes a plurality of cell strings. Each cell string comprises a source select transistor, a plurality of memory cells and a drain select transistor which are connected to each other in series. A source of the source select transistor is connected to a common source line, and a drain of the drain select transistor is connected to a bit line. Gates of the source select transistors are connected to each other to form a source select line, gates of the drain select transistors are connected to each other to form a drain select line and gates of the memory cells are connected to each other to form a word line. The word line is formed between the drain select line and the source select line, and the bit line intersects the word line.

Figure 1:
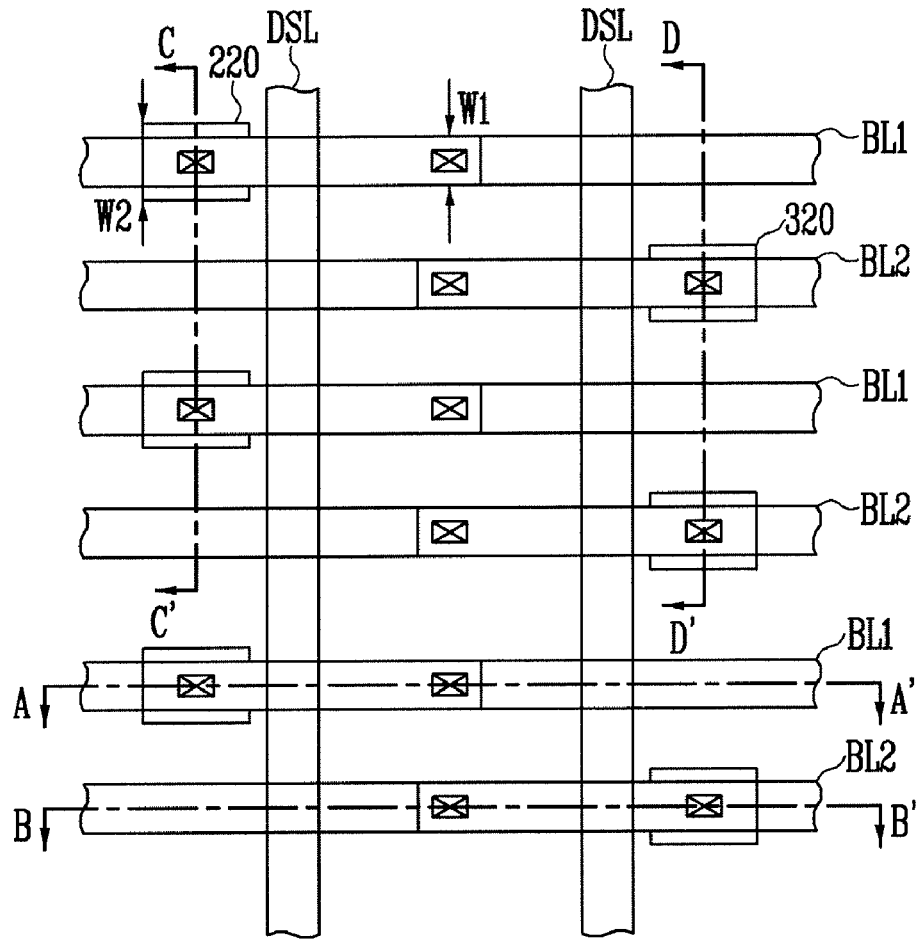
FIG. 1 is a plane view of a semiconductor memory device according to embodiments of the present invention.
Figure 2A:
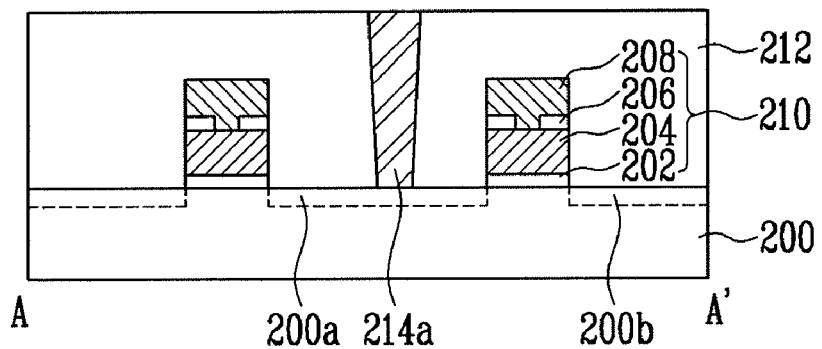
FIG. 2A to FIG. 2G are cross-sectional views taken along line A-A' in FIG. 1 for illustrating sequentially a method of manufacturing a semiconductor memory device according to embodiments of the present invention.
Figure 2B:
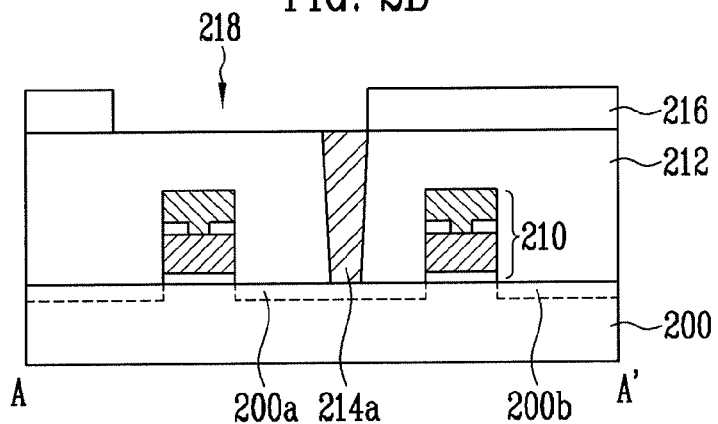
Figure 2C:
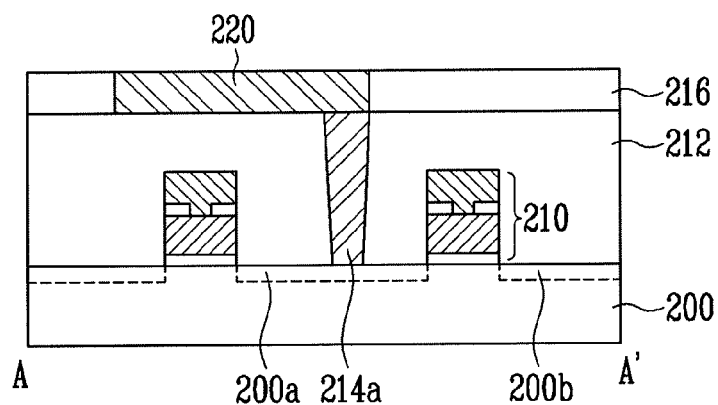
Figure 2D:
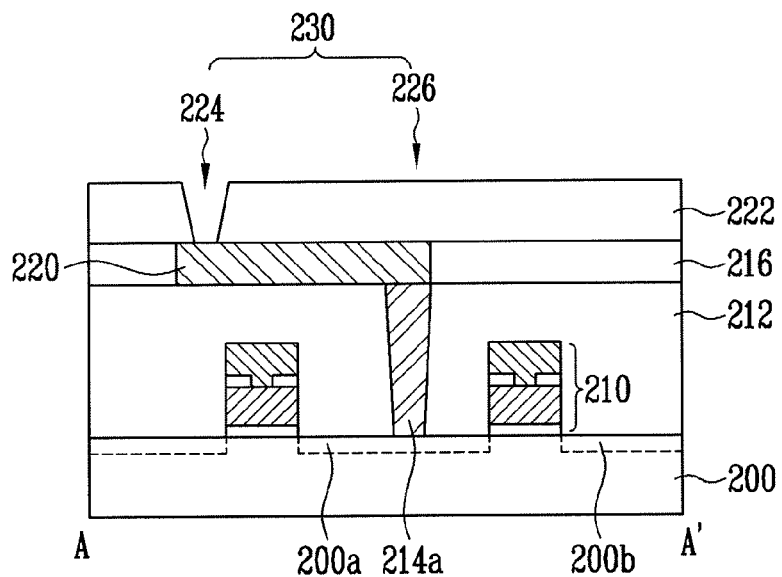
Figure 2E:
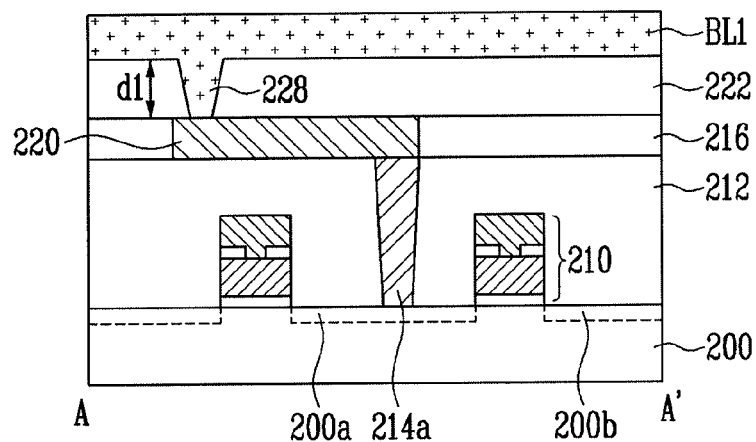
Figure 2F:
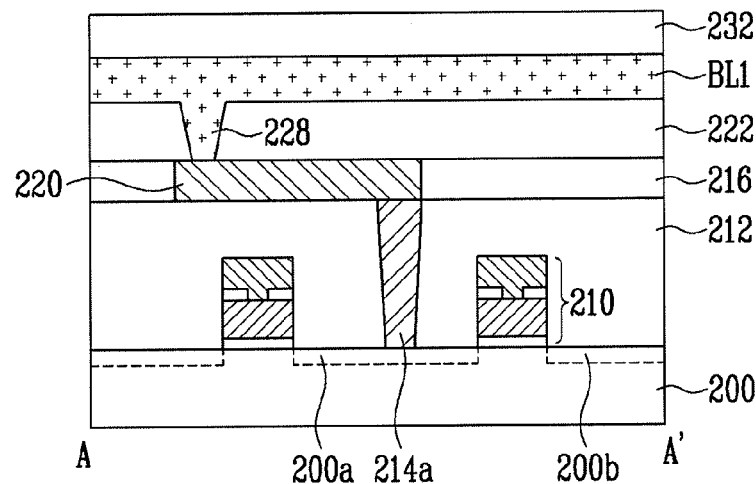
Figure 2G:
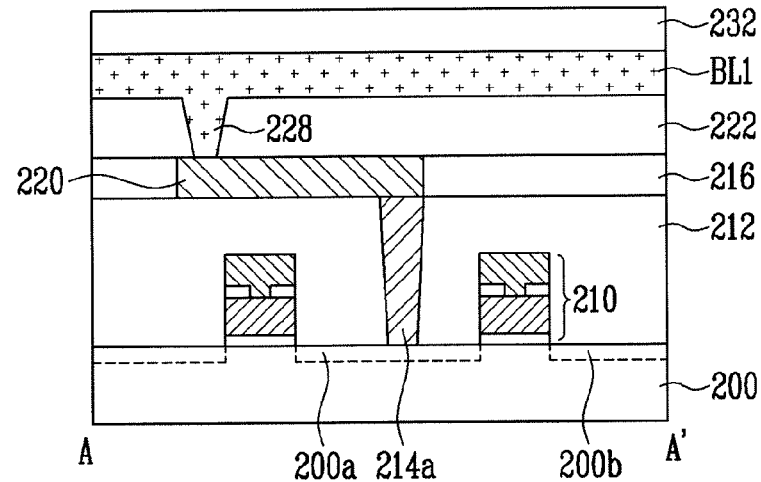
Figure 3A:
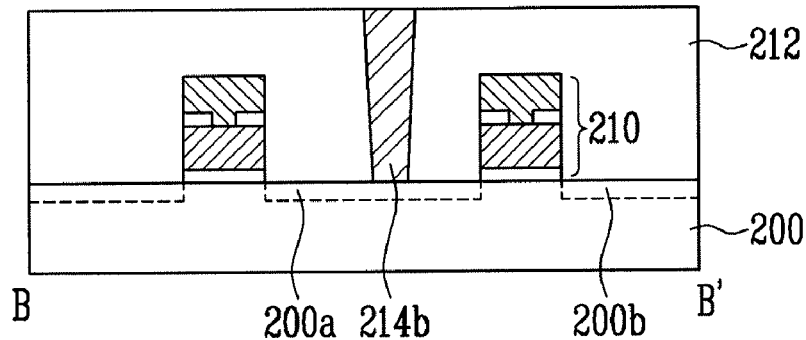
FIG. 3A to FIG. 3G are cross-sectional views taken along line B-B' in FIG. 1 for illustrating sequentially the method of manufacturing a semiconductor memory device according to embodiments of the present invention.
Figure 3B:
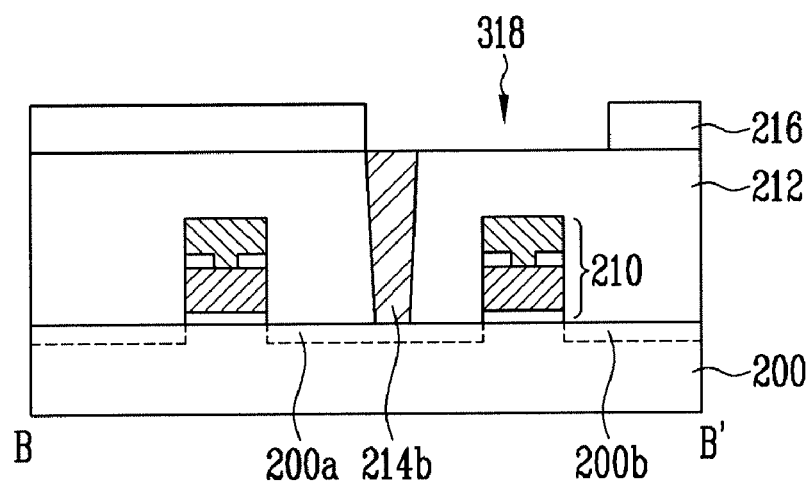
Figure 3C:
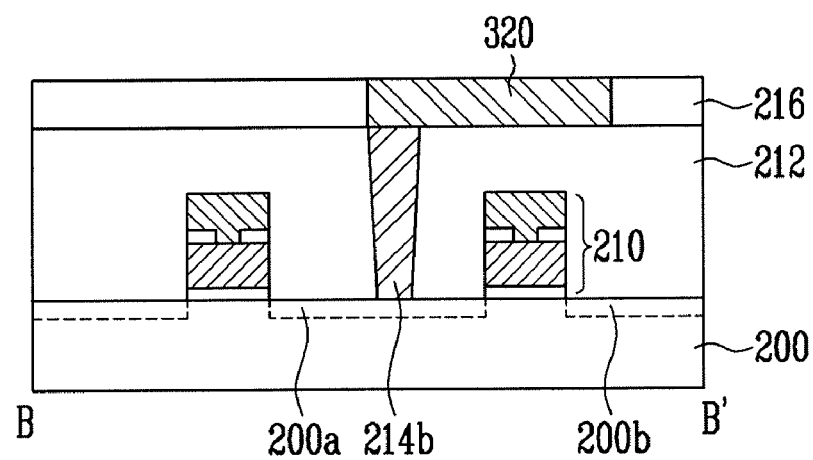
Figure 3D:
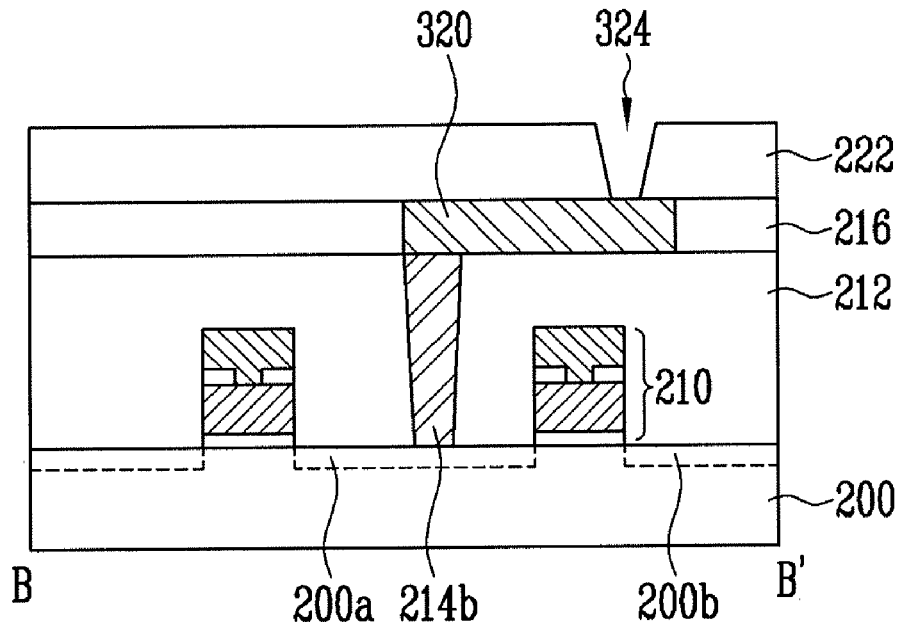
Figure 3E:
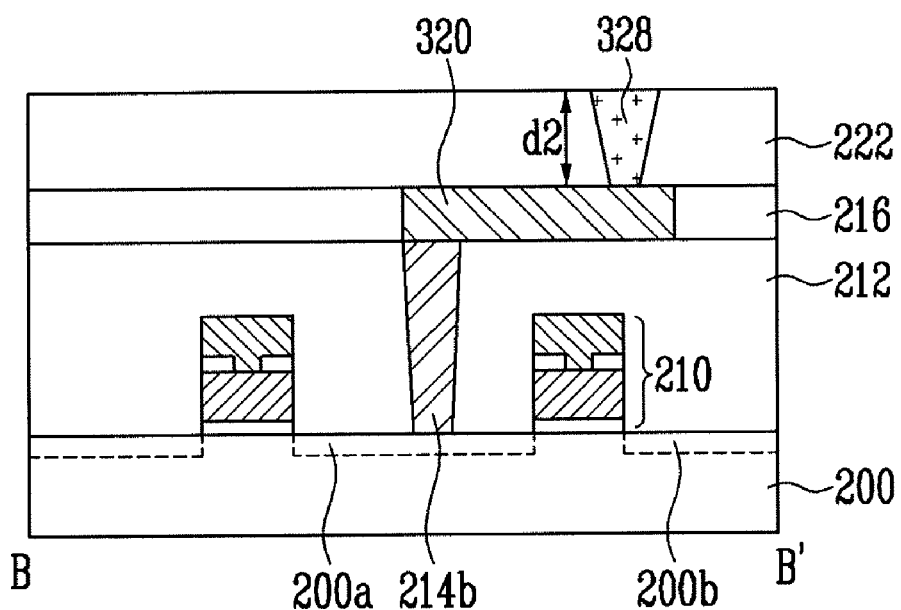
Figure 3F:
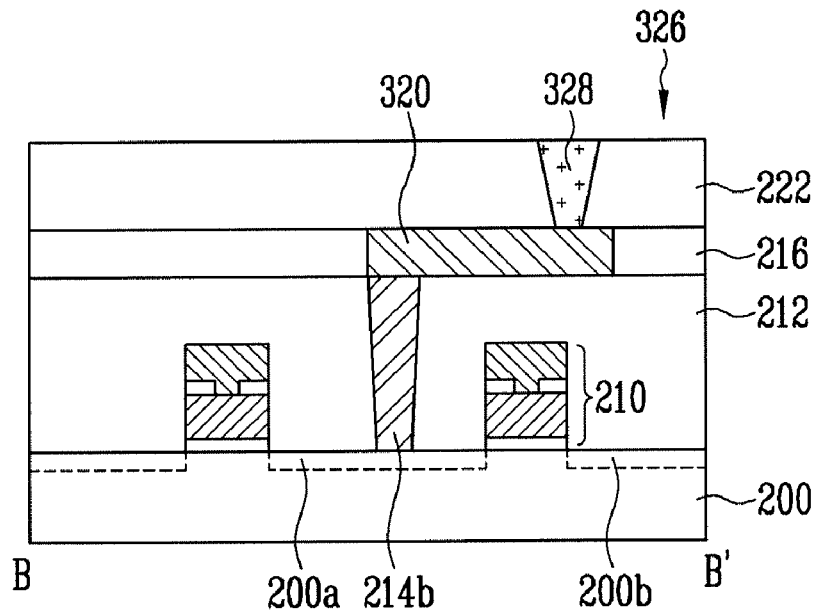
Figure 3G:
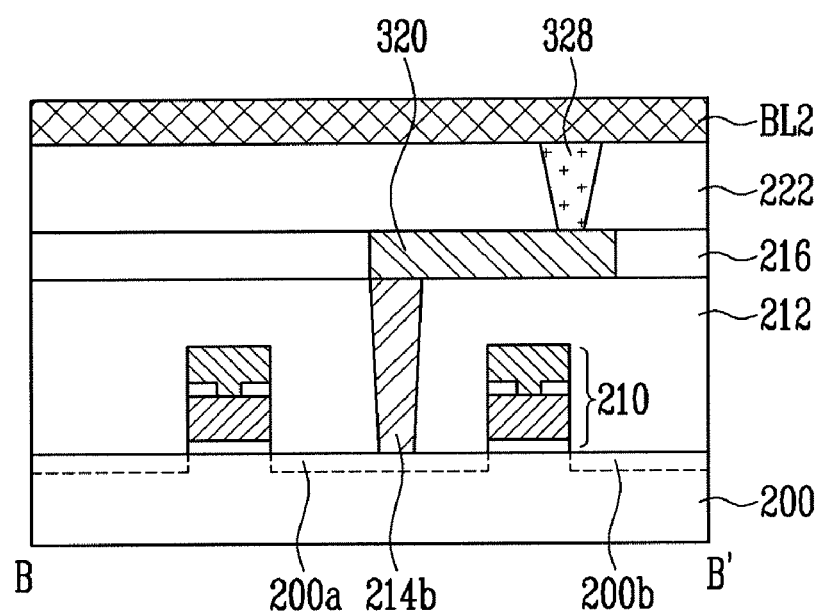
Figure 4A:
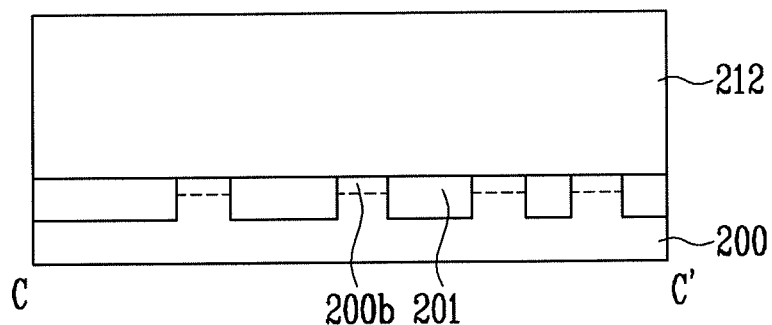
FIG. 4A to FIG. 4G are cross-sectional views taken along line C-C' in FIG. 1 for illustrating sequentially the method of manufacturing a semiconductor memory device according to embodiments of the present invention.
Figure 4B:
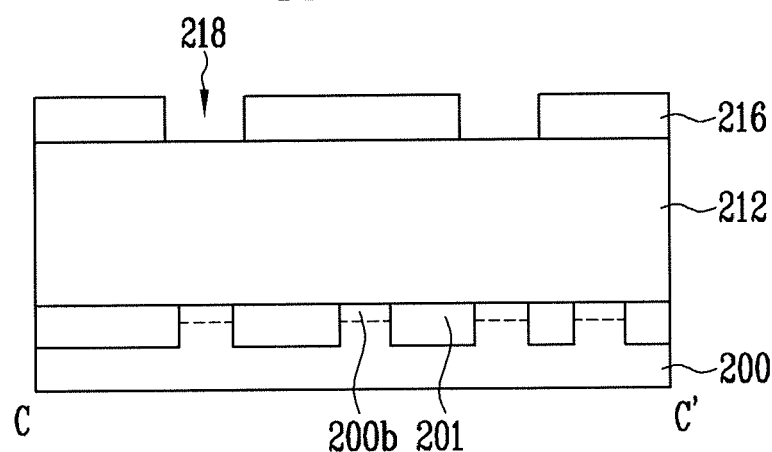
Figure 4C:
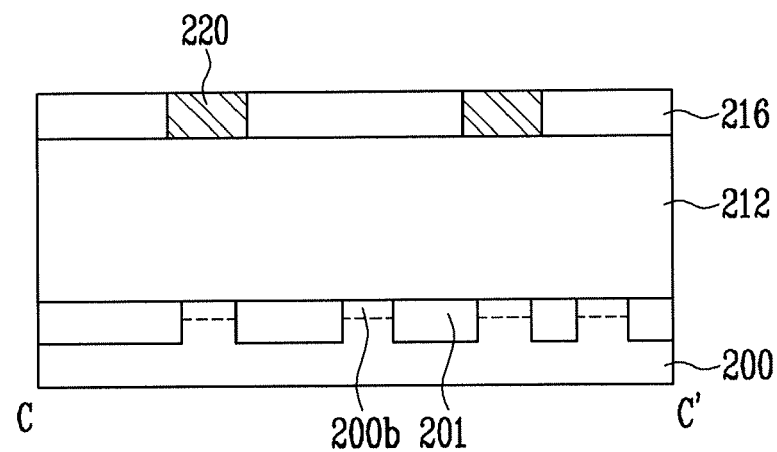
Figure 4D:
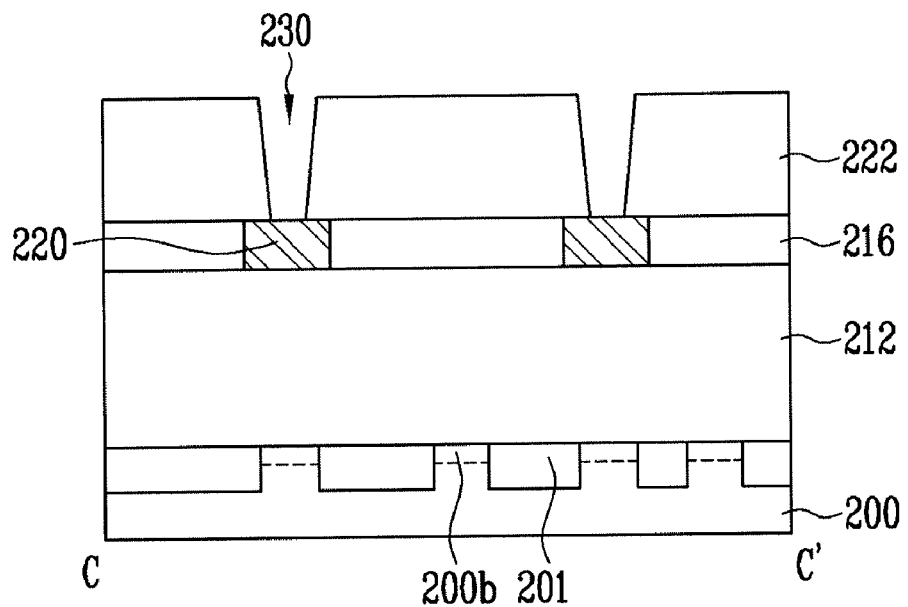
Figure 4E:
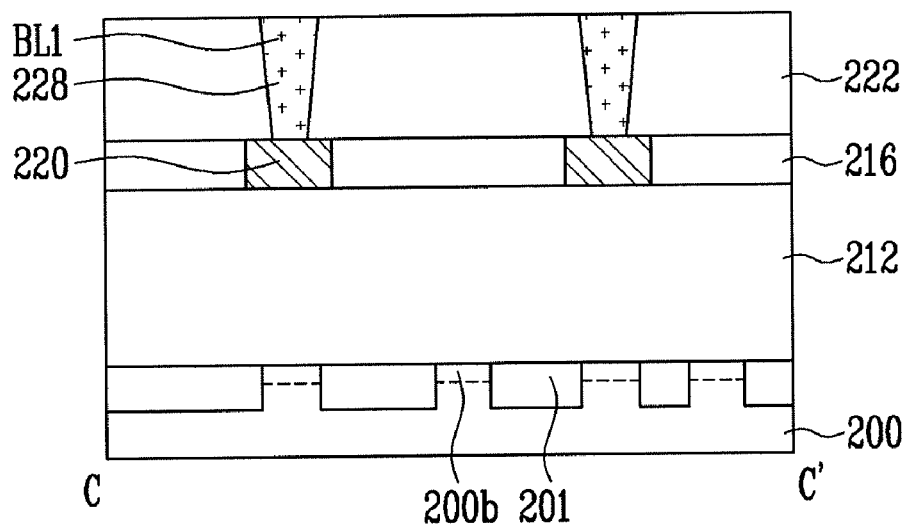
Figure 4F:
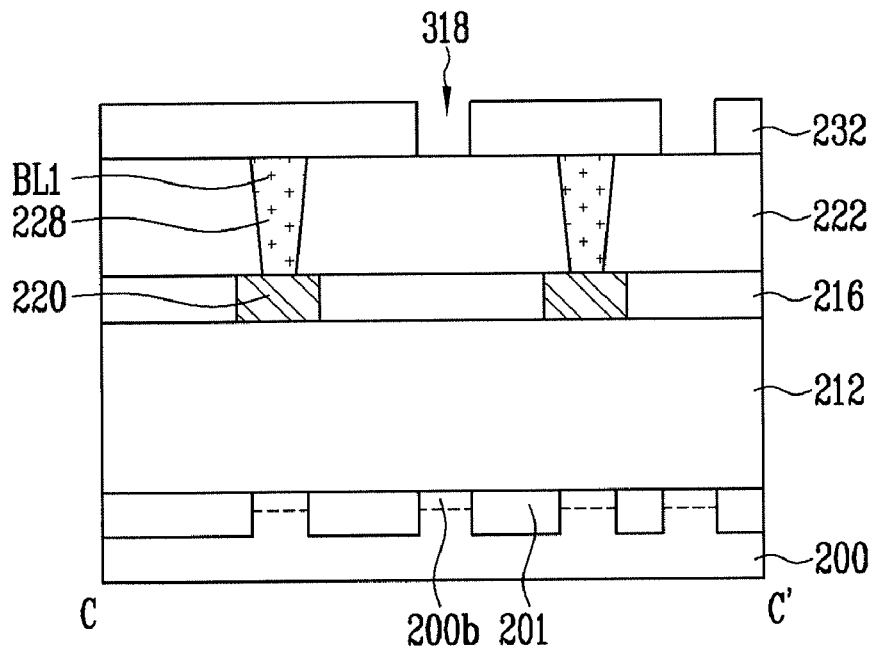
Figure 4G:
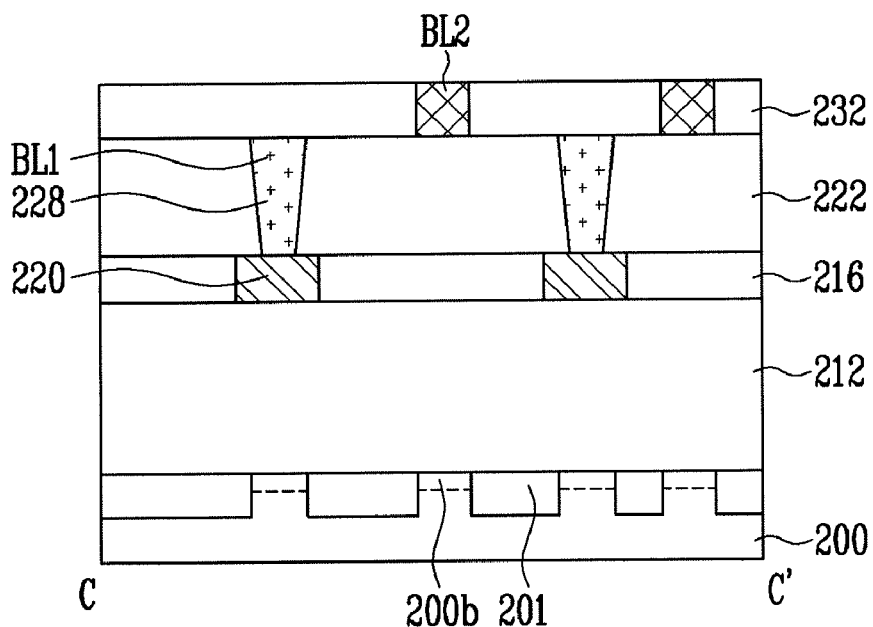
Figure 5A:
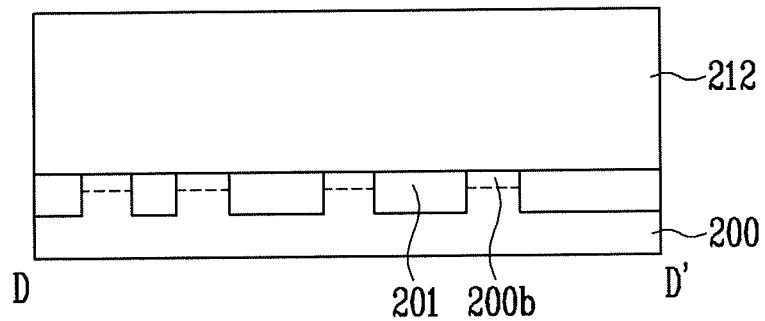
FIG. 5A to FIG. 5G are cross-sectional views taken along line D-D' in FIG. 1 for illustrating sequentially the method of manufacturing a semiconductor memory device according to embodiments of the present invention.
Figure 5B:
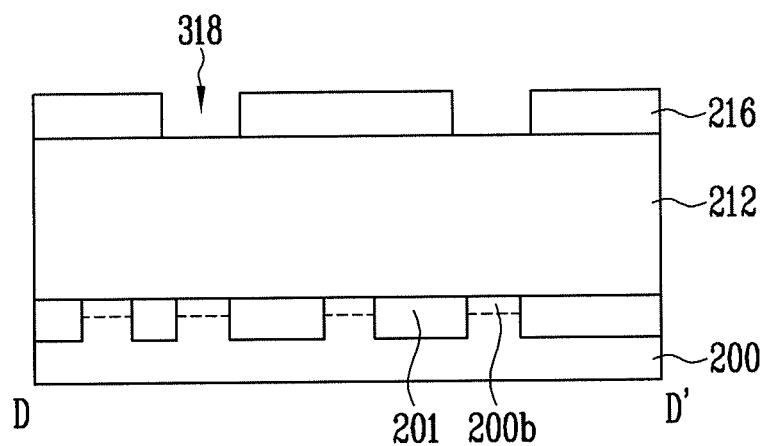
Figure 5C:
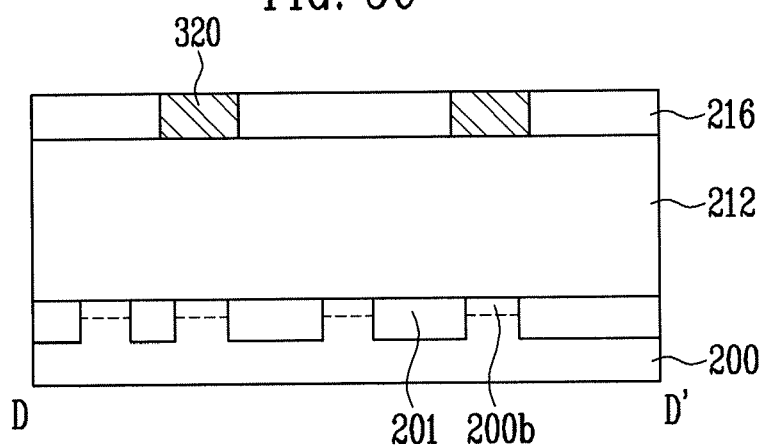
Figure 5D:
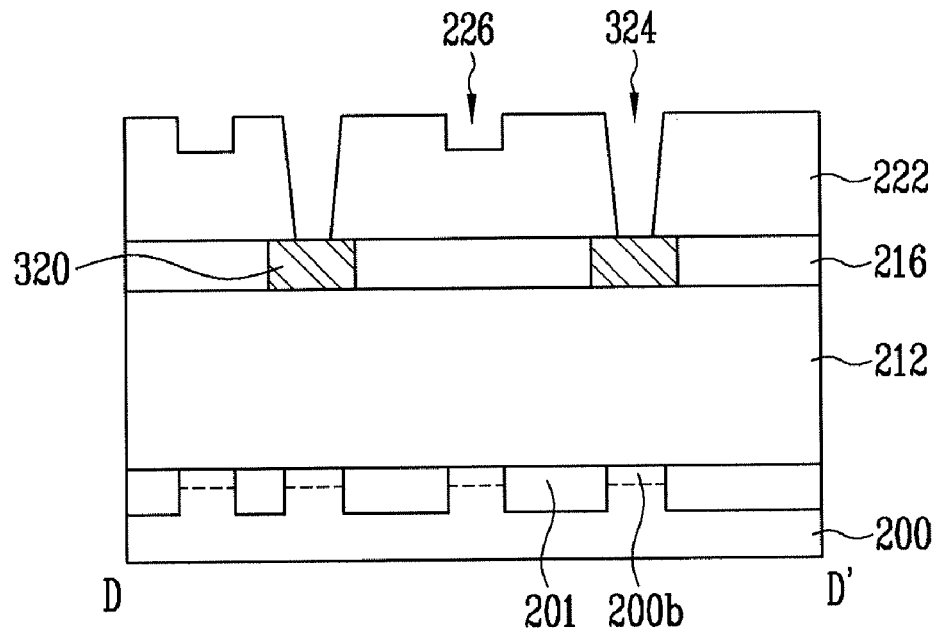
Figure 5E:
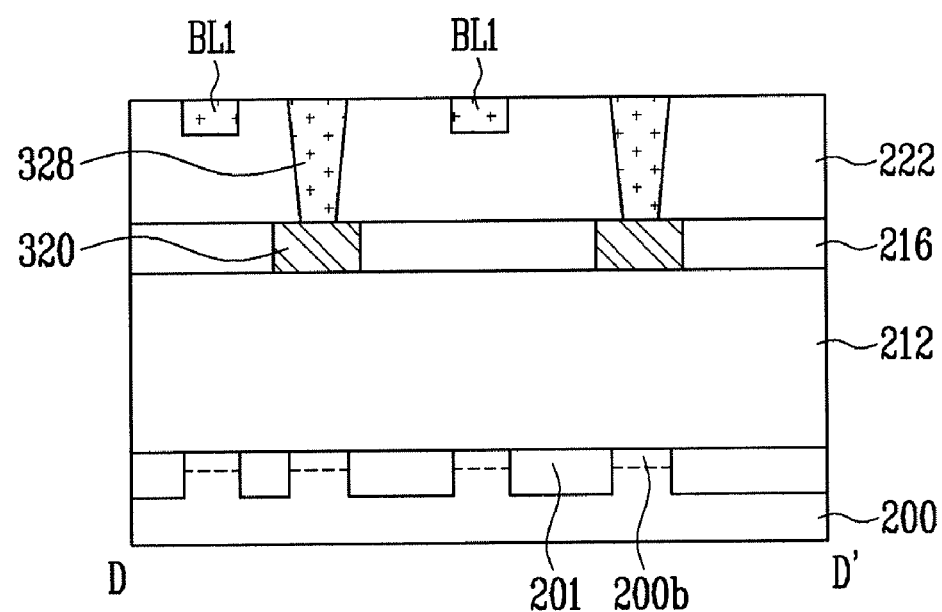
Figure 5F:
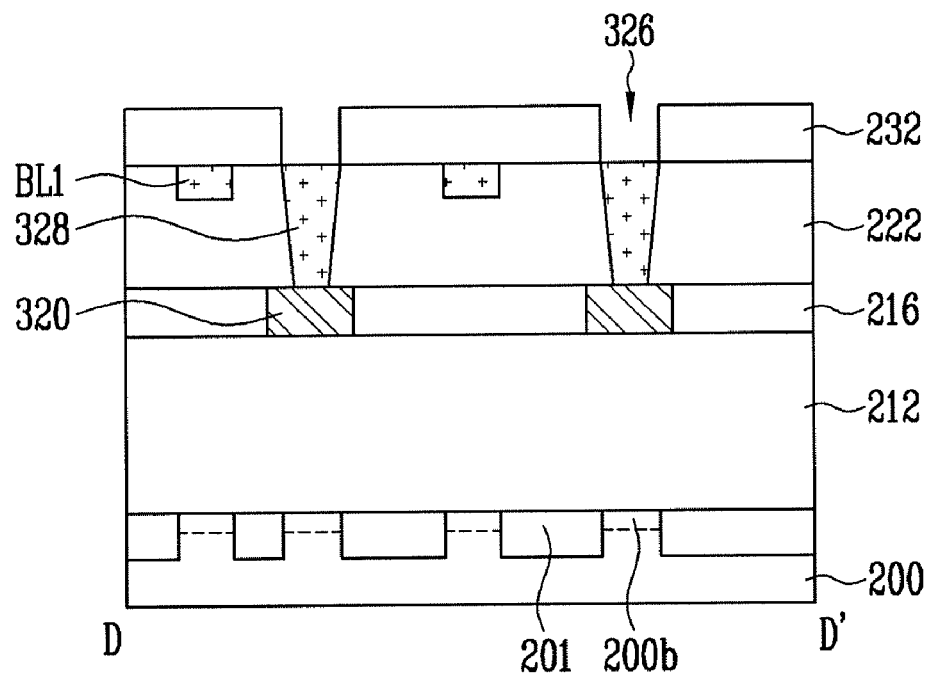
Figure 5G:
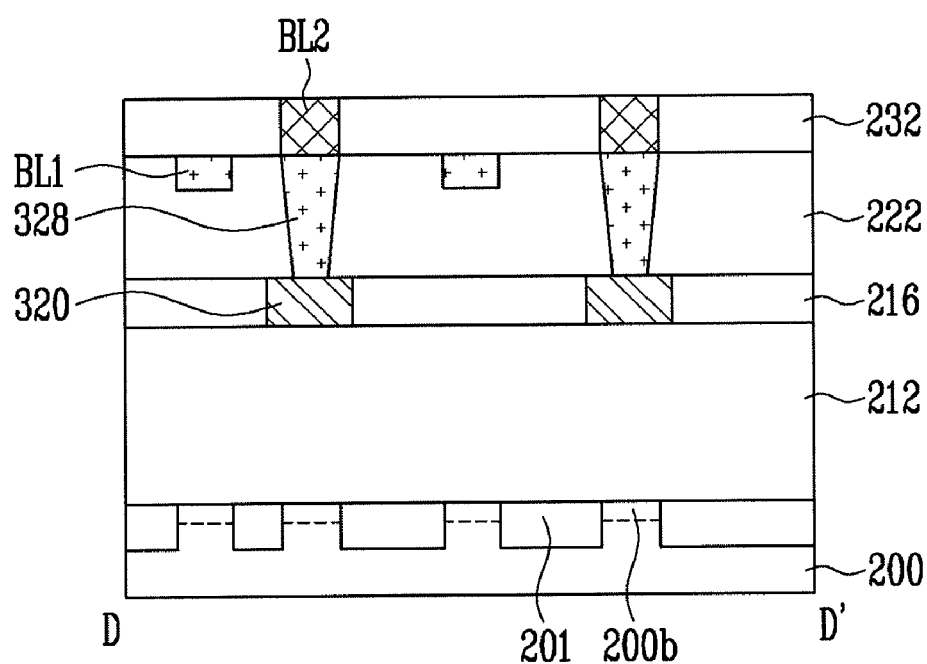

FIG. 1 is a plane view of a semiconductor memory device according to embodiments of the present invention, FIG. 2A to FIG. 2G are cross-sectional views taken along line A-A' in FIG. 1 for illustrating sequentially a method of manufacturing a semiconductor memory device according to embodiments of the present invention, FIG. 3A to FIG. 3G are cross-sectional views taken along line B-B' in FIG. 1 for illustrating sequentially the method of manufacturing a semiconductor memory device according to embodiments of the present invention, FIG. 4A to FIG. 4G are cross-sectional views taken along line C-C' in FIG. 1 for illustrating sequentially the method of manufacturing a semiconductor memory device according to embodiments of the present invention, and FIG. 5A to FIG. 5G are cross-sectional views taken along line D-D' in FIG. 1 for illustrating sequentially the method of manufacturing a semiconductor memory device according to embodiments of the present invention.

Referring to FIG. 1, FIG. 2A, FIG. 3A, FIG. 4A and FIG. 5A, a semiconductor substrate 200 on which gate patterns 210, junction regions 200a and 200b and contact plugs 214a and 214b are formed is provided. The contact plugs 214a and 214b are formed on the junction region 200a between the gate patterns 210 (for example, drain select lines).

The gate pattern 210 has a structure in which a tunnel insulating layer 202, a floating gate 204, a dielectric layer 206 and a control gate 208 are sequentially laminated. A hard mask may be formed on the control gate 208. In the gate patterns 210, the control gates 208 are connected to each other to form the word line, the source select line or the drain select line. The drain select line DSL shown in the drawings is a portion of the gate pattern 210 to which the control gate 208 is connected. In the gate patterns 210, the dielectric layer 206 constituting the drain select line DSL and the source select line has a contact hole through which the floating gate 204 is exposed. Thus, the floating gate 204 and the control gate 208 are electrically connected to each other in the drain select line DSL and the source select line through the contact hole.

An ion implantation process is performed on the semiconductor substrate 200 using the gate pattern 210 as a mask to form the junction regions 200a and 200b. The junction regions 200a and 200b are isolated from each other by an isolation layer 201. The junction regions 200a and 200b comprise the drain region 200a formed between the drain select lines DSL, a source region formed between the source select lines and the cell junction region 200b formed between the word lines.

The contact plugs 214a and 214b are formed on the junction regions 200a. The contact plugs 214a and 214b are connected to respective junction regions 200a in a first insulating layer 212 covering the gate patterns 210.

An example of a process of forming the contact plugs 214a and 214b is described in detail below.

The first insulating layer 212 is formed on the semiconductor substrate 200 on which the gate pattern 210 and the junction regions 200a and 200b are formed. A contact mask pattern is formed on the first insulating layer 212. The first insulating layer 212 exposed through the contact mask pattern is removed.

A plurality of contact holes that expose the junction region 200a are formed on a portion from which the first insulating layer 212 is removed. A remaining photoresist and the contact mask pattern are removed through a stripping process and a cleaning process. The contact hole is filled with conductive material. Tungsten, polysilicon and the like may be utilized as the conductive material. Thereafter, a chemical mechanical polishing process (hereinafter, referred to as "CMP process") is performed to expose the first insulating layer 212. As a result, the contact plugs 214a and 214b are formed in the contact holes.

Referring to FIG. 1, FIG. 2B, FIG. 3B, FIG. 4B and FIG. 5B, a second insulating layer 216 comprising first and second pad holes 218 and 318 is formed. The first and second pad holes expose the contact plugs 214a and 214b and extend in different directions.

In more detail, the second insulating layer 216 is formed on the first insulating layer 212 to cover the contact plugs 214a and 214b. A pad mask pattern is formed on the second insulating layer 216. The second insulating layer 216 is removed by an etching process using the pad mask pattern. When the etching process for removing the second insulating layer is performed, the gate pattern 210 is damaged by removal of the first insulating layer 212. In order to prevent damage to the gate pattern, an etching stop layer having an etching ratio which differs from that of the second insulating layer 216 may be further formed between the first insulating 212 and the second insulating layer 216. When the etching stop layer is formed, the contact hole and the contact plug 214a, 214b penetrate the etching stop layer. The first and second pad holes 218 and 318 are formed on portions from which the first insulating layer 212 is removed. The contact plugs 214a and 214b are exposed through the first and second pad holes 218 and 318. A remaining photoresist and the pad mask pattern are then removed through a stripping process and a cleaning process.

The first pad hole 218 and the second pad hole 318 extend from the contact plugs 214a and 214b toward the drain select line DSL. The first pad hole 218 exposes the odd-numbered contact plugs 214a, and the second pad hole 318 exposes the even-numbered contact plugs 214b. In order to prevent the first pad hole 218 from being in communication with the second pad hole 318, the first pad hole 218 and the second pad hole 318 extend in opposite directions with respect to the contact plugs 214a, 214b. In other words, the first contact hole 218 is extended in one side direction and the second pad hole 318 is extended in an opposite side direction.

Referring to FIG. 1, FIG. 2C, FIG. 3C, FIG. 4C and FIG. 5C, first and second conductive pads 220 and 320 are formed in the first and second pad holes 218 and 318, respectively. The first and second conductive pads 220 and 320 are connected to the contact plugs 214a and 214b, respectively. The first and second conductive pads 220 and 320 are alternately disposed. A method for forming the first and second conductive pads 220 and 320 is described in detail below.

The first and second pad holes 218 and 318 are filled with conductive material (e.g., tungsten). A CMP process is performed to expose the second insulating layer 216. As a result, the first and second conductive pads 220 and 320 are formed in the first and second pad holes 218 and 318, respectively. For securing stability, the first and second conductive pads 220 and 320 are formed such that a width W2 of portions to be connected to the first and second pad contact plugs formed in a subsequent process is larger than a width W1 of portions to be connected to the first and second contact plugs 214a and 214b. In addition, the first and second conductive pads 220 and 320 may be formed between the drain select lines DSL. However, in order to prevent end portions of the first and second conductive pads 220, 320 having width W2 from being connected to each other, the first conductive pad may extend in a direction opposite to a direction in which the second conductive pad extends. Thus, the first and second conductive pads 220, 320 intersect the drain select lines DSL.

Referring to FIG. 1, FIG. 2D, FIG. 3D, FIG. 4D and FIG. 5D, after the first and second conductive pads 220 and 320 are formed, a third insulating layer 222 including a dual damascene pattern 230 and a second pad contact hole 324 is formed on the second insulating layer 216. The dual damascene pattern 230 comprises a first pad contact hole 224 and a first trench 226. An extended portion of the first conductive pad 220 is exposed through the first pad contact hole and the first trench communicates with the first pad contact hole 224. A method of forming the third insulating layer 222 comprising the dual damascene pattern 230 and the second pad contact hole 324 is described in detail below.

The third insulating layer 222 is formed on the second insulating layer 216 to cover the first and second conductive pads 220 and 320. A pad contact mask pattern is formed on the third insulating layer 222. The third insulating layer 222 is removed by an etching process using the pad contact mask pattern. The first pad contact hole 224 exposing the first conductive pad 220 and the second pad contact hole 324 exposing the second conductive pad 320 are formed on a portion from which the third insulating layer 222 is removed. A remaining photoresist and the pad contact mask pattern are then removed through a stripping process and a cleaning process.

Subsequently, a trench mask pattern is formed on the third insulating layer 222 including the first and second pad contact holes 224 and 324. The third insulating layer 222 exposed through the trench mask pattern is etched to a certain depth to form the first trenches 226 in the third insulating layer 222. Each first trench 226 is in communication with a respective first pad contact hole 224. The first trenches 226 intersect the drain select line DSL to define areas on which the first bit lines BL1 are subsequently formed. A remaining photoresist and the trench mask pattern are then removed through a stripping process and a cleaning process.

Referring to FIG. 1, FIG. 2E, FIG. 3E, FIG. 4E and FIG. 5E, a first pad contact plug 228 and the first bit line BL1 are formed in the dual damascene pattern 230, and a second pad contact plug 328 is formed in the second pad contact hole 324. A method of forming the first pad contact plug 228, the first bit line BL1 and the second pad contact plug 328 is described in detail below.

The dual damascene pattern 230 and the second pad contact hole 324 are filled with conductive material (e.g., tungsten). A CMP process is performed to expose the third insulating layer 222. As a result, the first pad contact plug 228, the second pad contact plug 328 and the first bit lines BL1 are formed.

The first pad contact plug 228 electrically connects the first conductive pad 220 and the first bit line BL1. The second pad contact plug 328 is connected to the second conductive pad 320 and is insulated from the first bit line BL1 by the third insulating layer 222. A height (d2) of the second pad contact plug 328 is the same as the sum of a height of the first pad contact plug 228 and a height of the first bit line BL1. Thus, the second pad contact plug 328 is formed to have a height that is larger than a height (d1) of the first pad contact plug 228.

Referring to FIG. 1, FIG. 2F, FIG. 3F, FIG. 4F and FIG. 5F, a fourth insulating layer 232 including a second trench 326 is formed on the third insulating layer 222 including the first pad contact plug 228, the first bit line BL2 and the second pad contact plug 328. The second trench 326 exposes the second pad contact plug 326. A method for forming the fourth insulating layer 232 including the second trench 326 is described in detail below.

The fourth insulating layer 232 is formed on the third insulating layer 222 including the first pad contact plug 228, the first bit line BL2 and the second pad contact plug 328. A trench mask pattern is formed on the fourth insulating layer 232. The fourth insulating layer 232 exposed through the trench mask pattern is removed such that the second pad contact plug 328 is exposed. Thus, the second trenches 326 are formed to be disposed alternately with the first trenches 226. The second trenches 326 intersect the drain select line DSL to define areas on which the second bit lines BL2 are subsequently formed. A remaining photoresist and the trench mask pattern are then removed through a stripping process and a cleaning process.

Referring to FIG. 1, FIG. 2G, FIG. 3G, FIG. 4G and FIG. 5G, the second bit lines BL2 are formed in the second trenches 326. The second bit line BL2 is electrically connected to the second conductive pad 320 through the second pad contact plug 328. A method for forming the second bit line BL2 is illustrated in detail below.

The second trench 326 is filled with conductive material (e.g., tungsten). A CMP process is performed to expose the fourth insulating layer 232. As a result, the second bit lines BL2 are formed. Each of the second bit lines BL2 is formed between adjacent first bit lines BL1. That is, the first bit lines BL1 and the second bit lines BL2 are alternately disposed.

In the present invention, the first bit lines BL1 and the second bit lines BL2 are formed alternately on different layers. As a result, a distance between neighboring bit lines BL1 and BL2 is increased. Thus, a capacitance of the parasitic capacitor formed by the bit lines BL1 and BL2 is reduced. Consequently, the present invention can improve resistive capacitive (RC) delay to enhance an operation speed of the semiconductor memory device.

In the semiconductor memory device according to another embodiment the present invention, although the bit lines BL1 and BL2 are formed on different layers, the bit lines BL1 and BL2 are connected to the first and second pad contact plugs 228 and 328, which have different heights. Thus, the bit lines can be electrically connected to the junction regions 200a.

In the present invention, the contact structure for connecting the bit lines BL1 and BL2 to the junction region 200a is divided into the contact plugs 214a, 214b and the pad contact plugs 228, 328. Thus, a height of the contact holes to be filled with the contact plugs 214a, 214b and 228, 328 becomes lower than a height of the contact hole formed by a conventional method. As a result, it is possible to improve a phenomenon in which a void is generated when the contact plug is formed. Accordingly, the present invention can reduce the number of poor quality semiconductor memory devices that are produced to increase yield. In the present invention, an alignment margin of the pad contact holes 324, 224 can be secured by additionally forming the conductive pads 220, 320 having a width which is larger than a width of the contact plugs 214a, 214b.

Figure 6A:
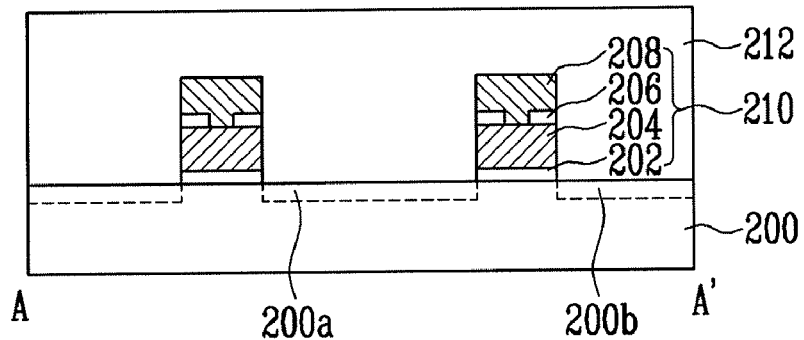
FIG. 6A to FIG. 6D are sectional views taken along line A-A' in FIG. 1 for illustrating sequentially another method for manufacturing a semiconductor memory device according to embodiments of the present invention.
Figure 6B:
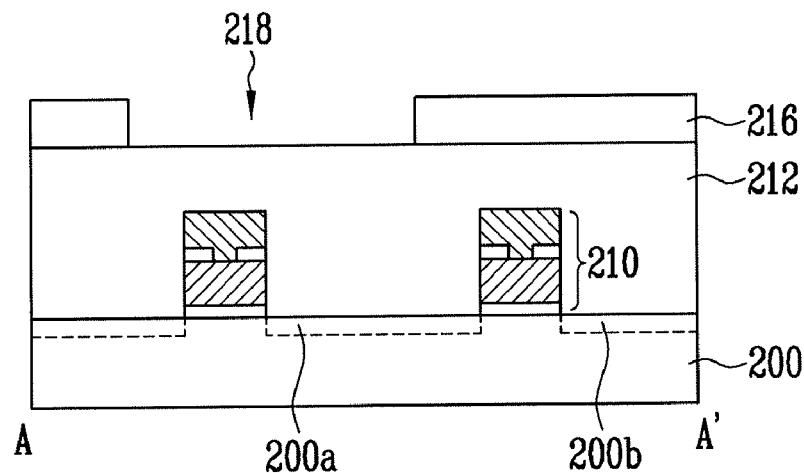
Figure 6C:
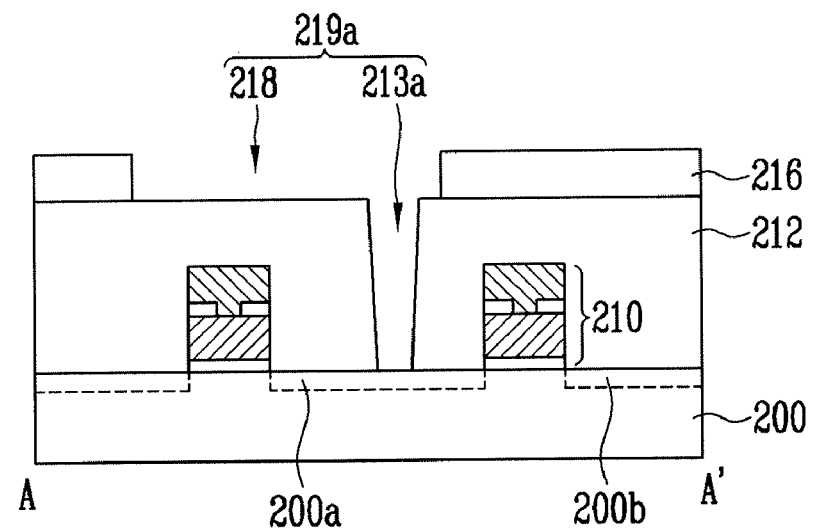

FIG. 6A to FIG. 6D are sectional views taken along line A-A' in FIG. 1 for illustrating sequentially another method for manufacturing the semiconductor memory device according to embodiments of the present invention. FIG. 7A to FIG. 7D are sectional views taken along line B-B' in FIG. 1 for illustrating sequentially another method for manufacturing the semiconductor memory device according to embodiments of the present invention Referring to FIG. 6A to FIG. 7A, the first insulating layer 212 is formed on the semiconductor substrate 200 including the gate pattern 210 and the junction regions 200a and 200b. The gate pattern 210 and the junction regions 200a and 200b are the same as those described with reference to FIG. 2A, FIG. 3A, FIG. 4A and FIG. 5A. However, FIG. 6A and FIG. 7A show that a contact hole is not formed in the first insulating layer 212.

Referring to FIG. 6B to FIG. 7B, the second insulating layer 216 including the first and second pad holes 218, 318 is formed on the first insulating layer 212. The first and second pad holes 218, 318 overlap the junction region 200a. The first and second pad holes 218, 318 are the same as those described with reference to FIG. 2B, FIG. 3B, FIG. 4B and FIG. 5B.

Referring to FIG. 6C to FIG. 7C, in the first insulating layer 212 exposed through the first and second pad holes 218, 318, a portion overlapping the junction regions 200a is exposed between the photoresist patterns formed through a photolithography process. The exposed first insulating layer 212 is removed through an etching process to form the contact holes 213a and 213b through which the junction region 200a is exposed. As described above, dual damascene patterns 219a and 219b including the first and second pad holes 218, 318 and the contact holes 213a, 231b are formed in the first and second insulating layer 212, 216.

Figure 6D:
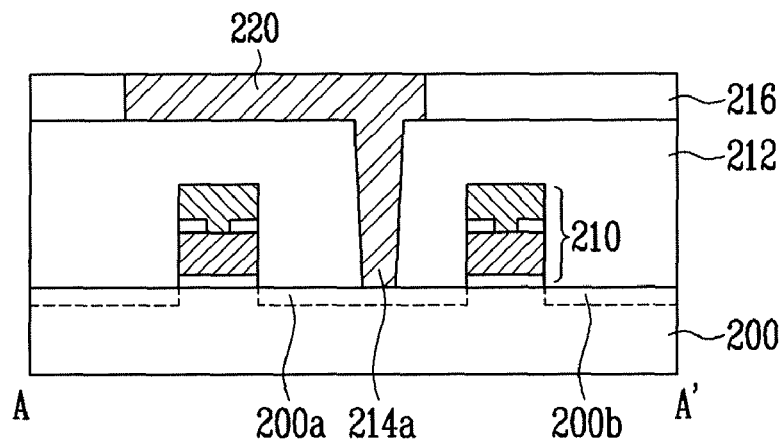
Figure 7A:
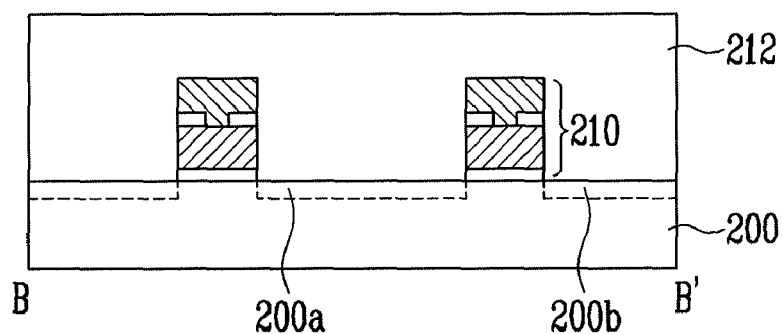
FIG. 7A to FIG. 7D are sectional views taken along line B-B' in FIG. 1 for illustrating sequentially another method for manufacturing a semiconductor memory device according to embodiments of the present invention.
Figure 7B:
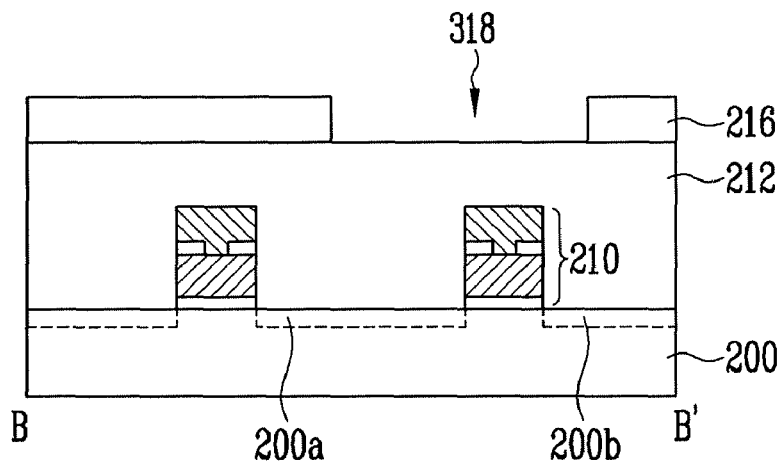
Figure 7C:
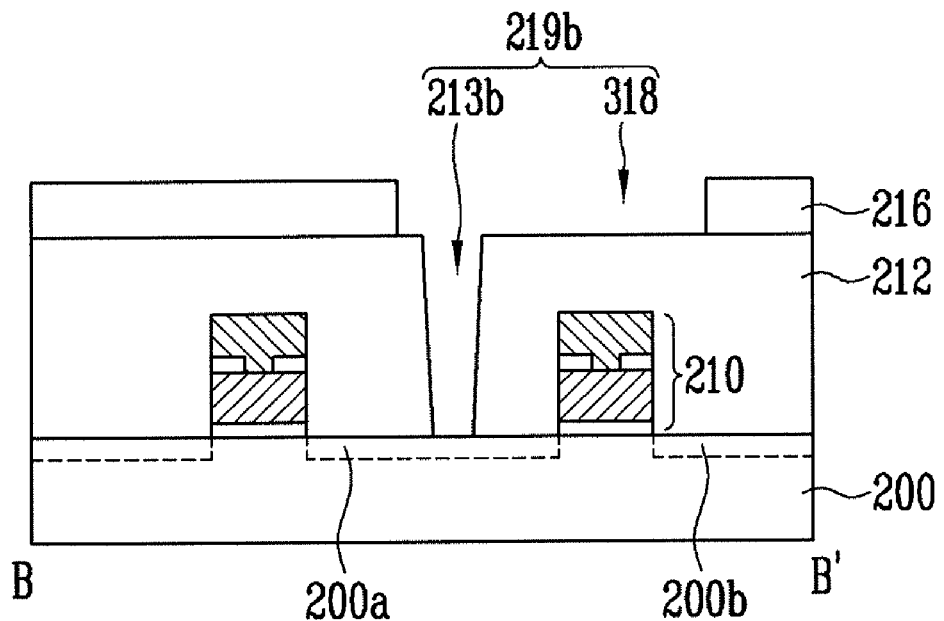
Figure 7D:
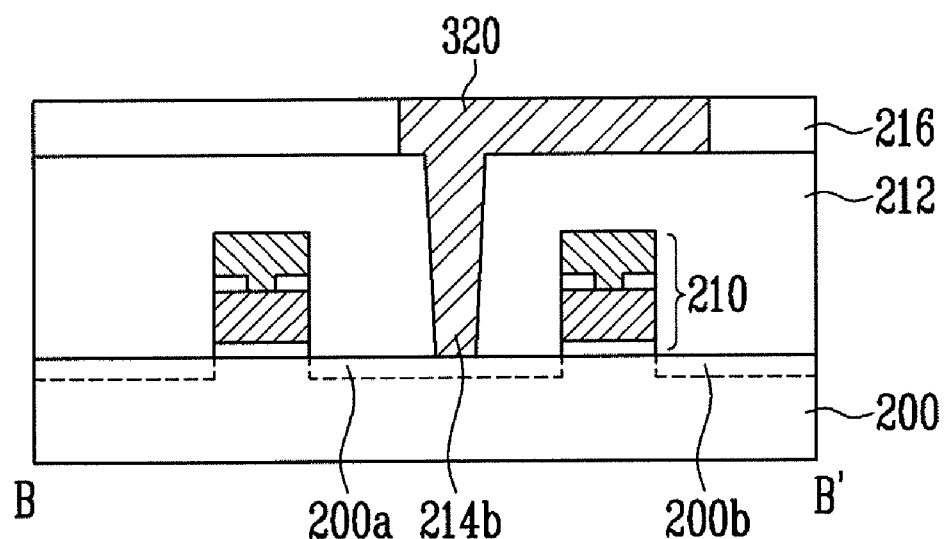

Referring to FIG. 6D and FIG. 7D, the dual damascene patterns 219a and 219b on the first and second insulating layer 212 and 216 are filled with conductive material. A CMP process is carried out to form the contact plugs 214a, 214b and the conductive pads 220, 320 connected electrically to the contact plugs 214a, 214b. A subsequent process performed after the conductive pads 220, 320 are formed is the same as the methods described above with reference to FIG. 2D to FIG. 2G, FIG. 3D to FIG. 3G, FIG. 4D to FIG. 4G and FIG. 5D to FIG. 5G.

In the semiconductor memory device according to embodiments of the present invention, the bit lines are divided into the first bit line and the second bit lines respectively connected to the first and second pad contact holes having different heights. Thus, the adjacent bit lines are formed in different layers. Accordingly, a distance between neighboring bit lines is increased to reduce the capacitance of a parasitic capacitor formed by the neighboring bit lines. Thus, the resistive capacitive (RC) delay can be improved to enhance an operation speed of a flash memory device.

In addition, since the contact structure for connecting the bit lines to the junction region is divided into the contact plug and the pad contact plug, it is possible to prevent generation of a void caused by a vertical height of the contact structure. Accordingly, embodiments of the present invention can reduce the number of poor quality semiconductor memory devices produced to increase yield. Furthermore, an alignment margin of the pad contact holes can be secured by forming the conductive pads.

Although the present invention has been described with reference to a number of illustrative embodiments, it should be understood that numerous other modifications and embodiments can be devised by those skilled in the art that will fall within the spirit and scope of the principles of this disclosure. Particularly, other variations and modifications are possible in the component parts and/or arrangements of the subject combination arrangement that are within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor memory device, the method comprising:
   providing a semiconductor substrate having junction regions and contact plugs formed thereon, the junction regions being formed between gate patterns and the contact plugs being connected to the corresponding junction regions in a first insulation layer with which the gate patterns are covered;
   forming a second insulating layer including first and second pad holes, wherein the first and second pad holes extend in different directions, the first and second pad holes exposing the contact plugs;
   forming first and second conductive pads in the first and second pad holes, respectively;
   forming a third insulating layer including dual damascene patterns and pad contact holes, wherein the dual damascene pattern exposes an extended portion of the first conductive pad, the pad contact hole exposing an extended portion of the second conductive pad;
   forming a first pad contact plug and a first bit line in the dual damascene pattern;
   forming a second pad contact plug in the pad contact hole;
   forming a fourth insulating layer including trenches that exposes the second pad contact plugs; and
   forming a second bit line in the trench.

2. The method of manufacturing a semiconductor memory device of claim 1, wherein the gate pattern comprises a tunnel insulating layer, a floating gate, a dielectric layer and a control gate formed sequentially and laminately over the semiconductor substrate.

3. The method of manufacturing a semiconductor memory device of claim 1, wherein the first conductive pads and the second conductive pads are alternately disposed.

4. The method of manufacturing a semiconductor memory device of claim 1, wherein the first and second conductive pads are configured such that a width of portions to be connected to the first and second pad contact plugs is larger than a width of portions through which the contact plugs are exposed.

5. The method of manufacturing a semiconductor memory device of claim 1, wherein each of the second pad contact plugs has a height that is larger than a height of each of the first pad contact plugs.

6. The method of manufacturing a semiconductor memory device of claim 1, wherein the first and second conductive pads extend such that the gate patterns intersect the first and second conductive pads.

7. A method of manufacturing a semiconductor memory device, the method comprising:
   providing a semiconductor substrate having junction regions, each junction region being formed between gate patterns;
   forming first and second insulating layers over the semiconductor substrate;
   forming first damascene patterns in the first and second insulating layers, wherein each first damascene pattern comprises first and second pad holes and contact holes in communication with the first and second pad holes, the first and second pad holes exposing the first insulating layer and extending in different directions, the contact holes penetrating the first insulating layer to expose the junction regions;
   forming a contact plug in each contact hole;
   forming a first conductive pad in each first pad hole;
   forming a second conductive pad in each second pad hole;
   forming a third insulating layer including a second dual damascene pattern that exposes an extended portion of each first conductive pad and pad contact holes that expose an extended portion of each second conductive pad;
   forming a first pad contact plug and a first bit line in the second dual damascene pattern;
   forming a second pad contact plug in each pad contact hole;
   forming a fourth insulating layer including trenches that expose the second pad contact plugs; and
   forming a second bit line in each trench.

8. The method of manufacturing a semiconductor memory device of claim 7, wherein the gate pattern comprises a tunnel insulating layer, a floating gate, a dielectric layer and a control gate formed sequentially and laminately over the semiconductor substrate.

9. The method of manufacturing a semiconductor memory device of claim 7, wherein the first conductive pads and the second conductive pads are alternately disposed.

10. The method of manufacturing a semiconductor memory device of claim 7, wherein the first and second conductive pads are configured such that a width of portions to be connected to the first and second pad contact plugs is larger than a width of portions through which the contact plugs are exposed.

11. The method of manufacturing a semiconductor memory device of claim 7, wherein each of the second pad contact plugs have a height that is larger than a height of each of the first pad contact plugs.

12. The method of manufacturing a semiconductor memory device of claim 7, wherein the first and second conductive pads extend such that the gate patterns intersect the first and second conductive pads.

* * * * *